(12) United States Patent
Kondo et al.

(10) Patent No.: US 8,686,488 B2
(45) Date of Patent: Apr. 1, 2014

(54) NONVOLATILE SEMICONDUCTOR MEMORY DEVICE AND METHOD OF MANUFACTURING THE SAME

(75) Inventors: Masaki Kondo, Kawasaki (JP);
Nobutoshi Aoki, Yokohama (JP);
Takashi Izumida, Yokohama (JP);
Tomomi Yoda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/602,634

(22) Filed: Sep. 4, 2012

(65) Prior Publication Data

US 2013/0240970 A1    Sep. 19, 2013

(30) Foreign Application Priority Data

Nov. 30, 2011   (JP) .................. 2011-261995

(51) Int. Cl.
*H01L 29/788* (2006.01)
*H01L 21/4763* (2006.01)

(52) U.S. Cl.
USPC ............ 257/316; 257/E29.129; 257/E29.3; 438/593

(58) Field of Classification Search
CPC ............ H01L 29/42324; H01L 27/115; H01L 27/11521; H01L 21/28273
USPC .............. 257/314, 315, 216, 317, E29.129, 257/E29.3, 316; 438/142, 151, 201, 257, 438/593
See application file for complete search history.

(56) References Cited

U.S. PATENT DOCUMENTS

| | | | | | |
|---|---|---|---|---|---|
| 4,812,898 | A | * | 3/1989 | Sumihiro | ................ 365/185.09 |
| 4,914,046 | A | * | 4/1990 | Tobin et al. | .................... 438/592 |
| 6,455,890 | B1 | * | 9/2002 | Chang et al. | .................. 257/321 |
| 2008/0090352 | A1 | * | 4/2008 | Lee et al. | ....................... 438/257 |

FOREIGN PATENT DOCUMENTS

| | | |
|---|---|---|
| JP | 7-115144 | 5/1995 |
| JP | 2000-40752 | 2/2000 |

* cited by examiner

*Primary Examiner* — Nikolay Yushin
(74) *Attorney, Agent, or Firm* — Oblon, Spivak, McClelland, Maier & Neustadt, L.L.P.

(57) ABSTRACT

According to one embodiment, a nonvolatile semiconductor memory device includes a semiconductor substrate, a gate insulating film formed on the semiconductor substrate, a floating gate electrode formed on the gate insulating film, made of polysilicon containing a p-type impurity as a group XIII element, and having a lower film and an upper film stacked on the lower film, an inter-electrode insulating film formed on the floating gate electrode, and a control gate electrode formed on the inter-electrode insulating film. One of a concentration and an activation concentration of the p-type impurity in the upper film is higher than one of a concentration and an activation concentration of the p-type impurity in the lower film.

16 Claims, 14 Drawing Sheets

| | FG structure |
|---|---|
| First embodiment | SiGe / PolySi |
| Second embodiment | Carbon — SiGe or PolySi / PolySi  { A, B } |
| Third embodiment | SiGe or PolySi / Carbon — PolySi |
| Fourth embodiment | Carbon — SiGe or PolySi / Carbon — PolySi  { A, B } |
| Fifth embodiment | SiGe or PolySi / Carbon — SiGe or PolySi / PolySi |

F I G. 1

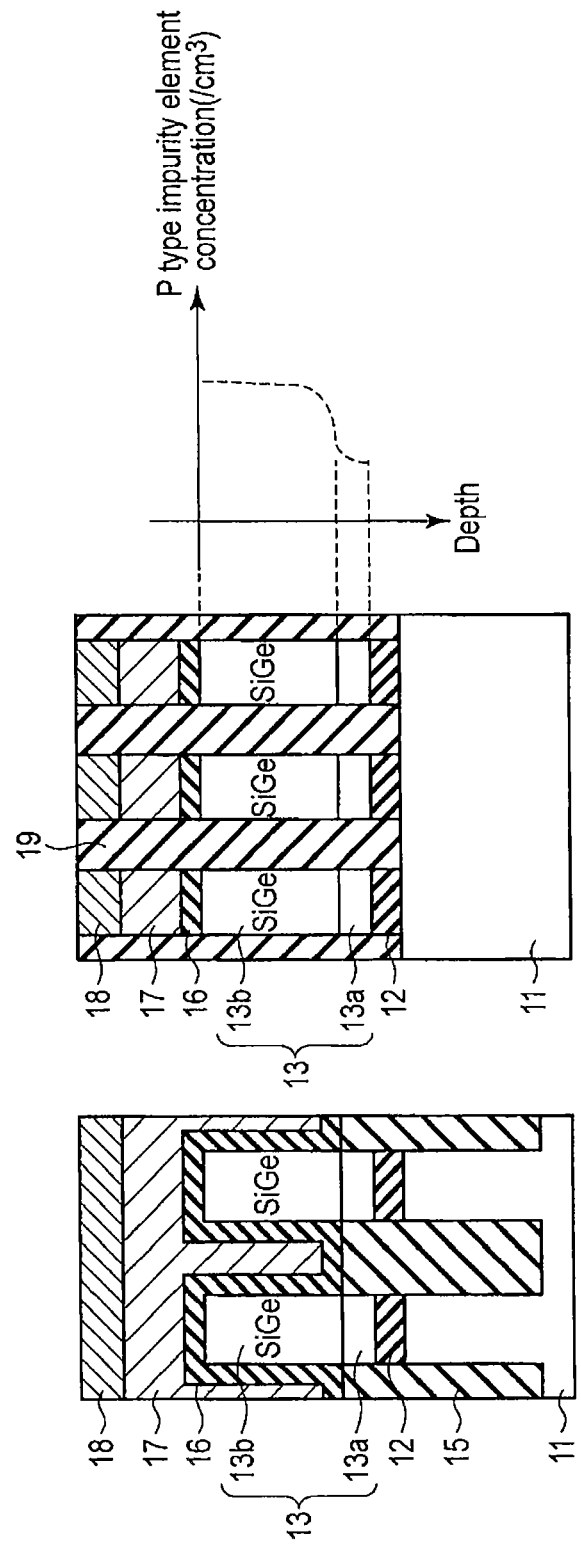

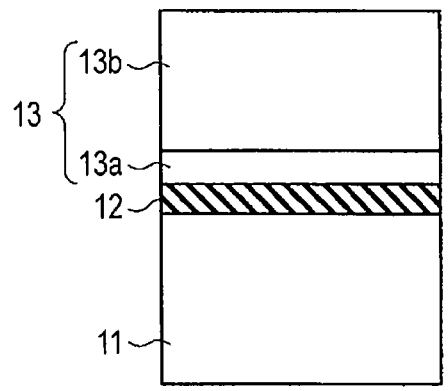
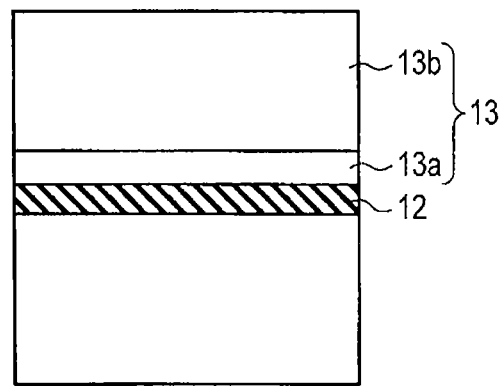
F I G. 3A       F I G. 3B
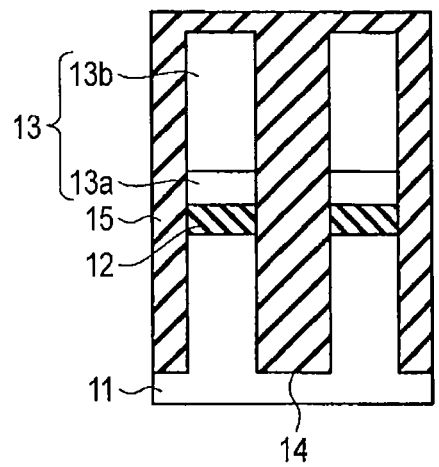
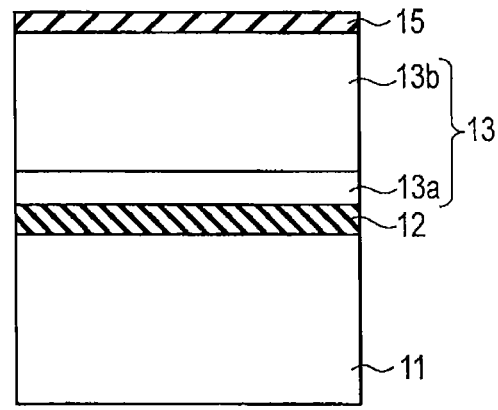
F I G. 4A       F I G. 4B

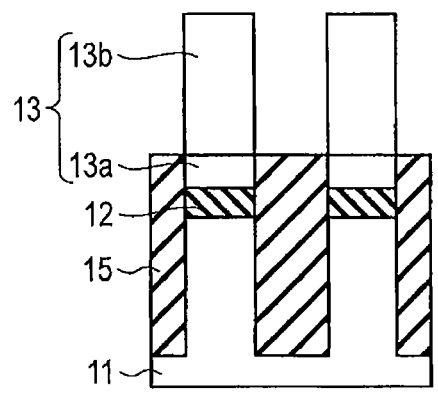 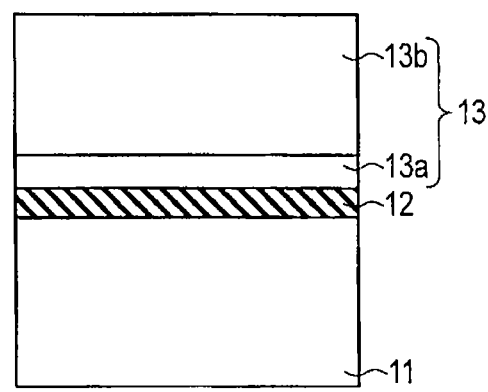
F I G. 5A   F I G. 5B
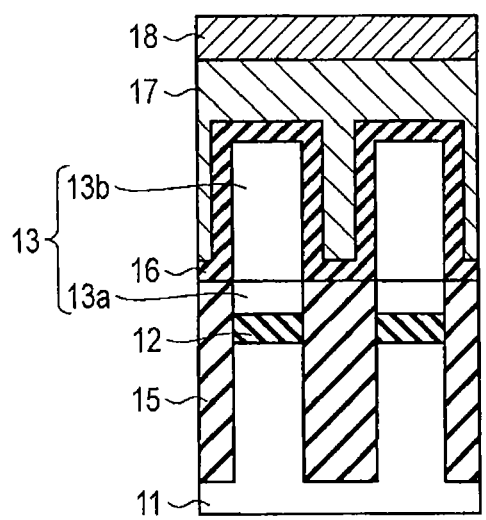 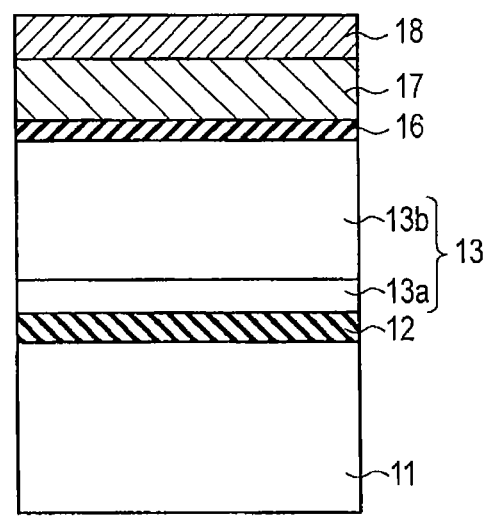
F I G. 6A   F I G. 6B

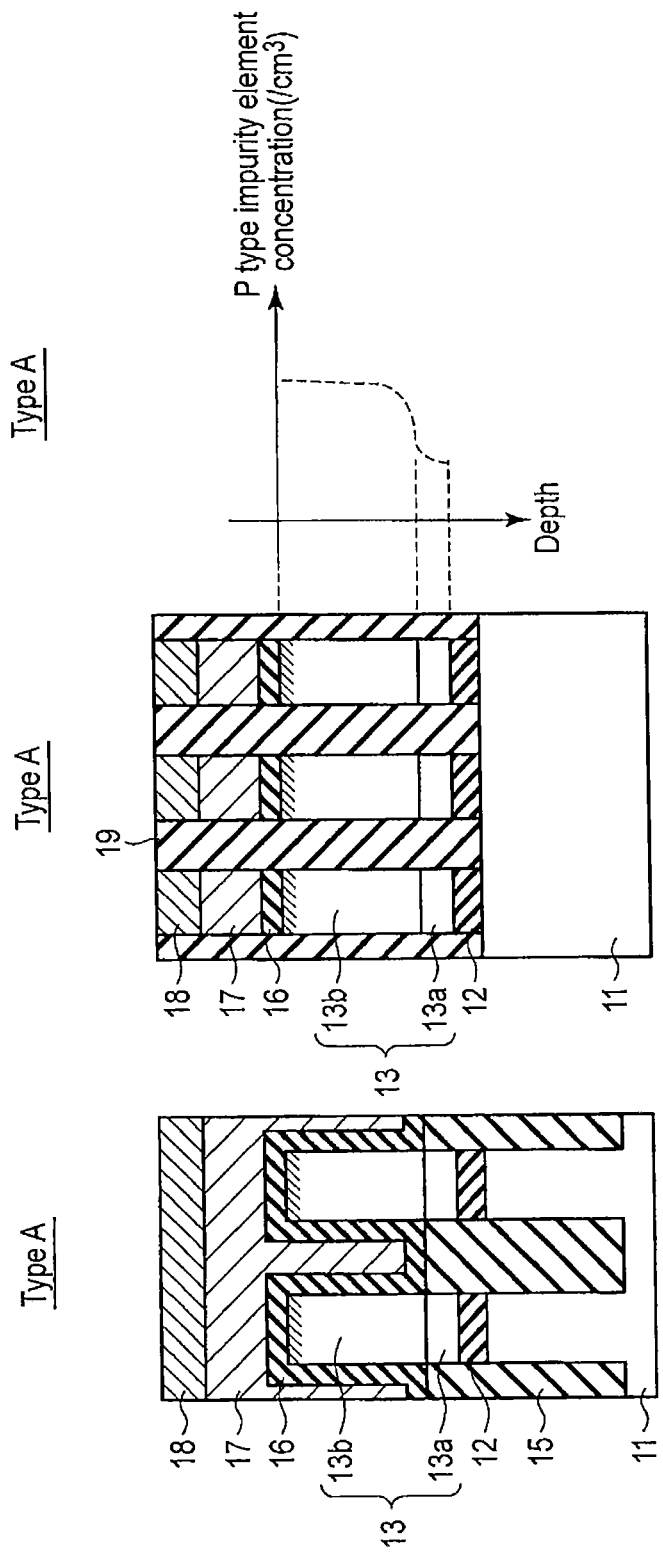

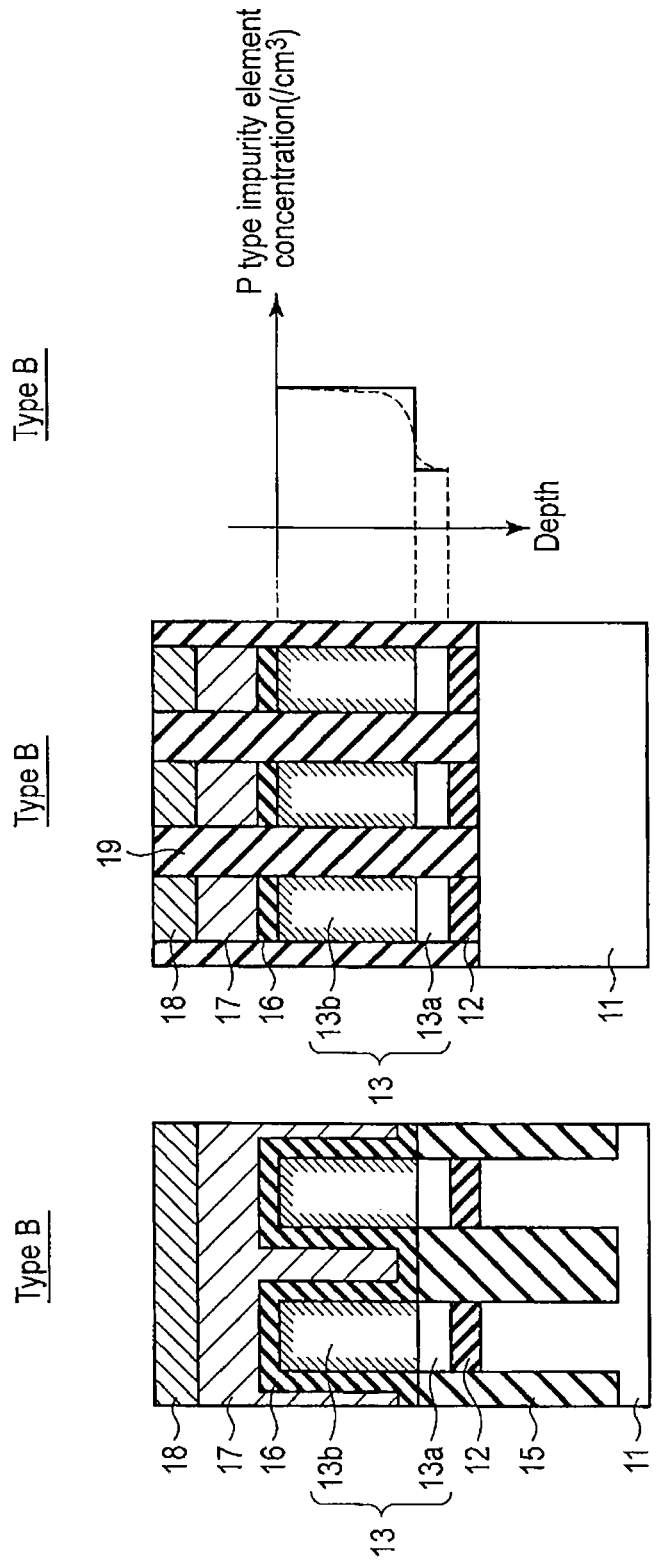

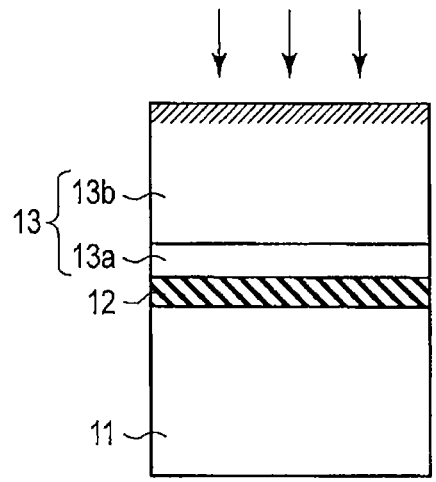
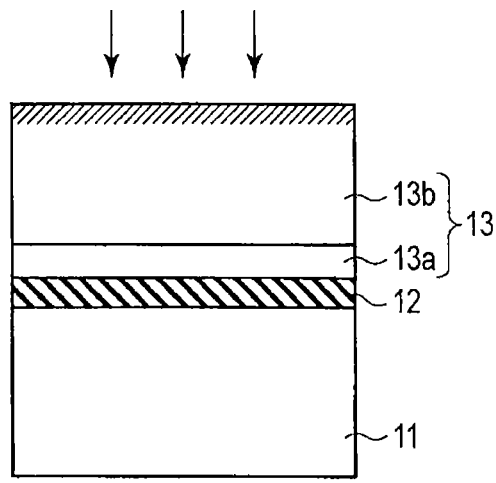
FIG. 9A    FIG. 9B
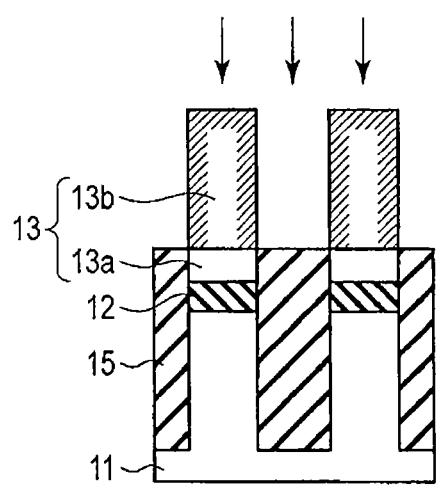
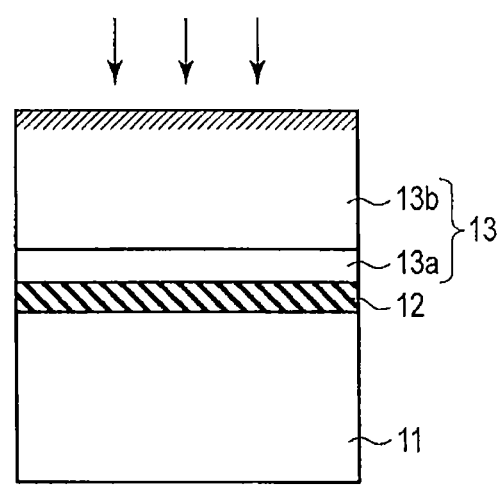
FIG. 10A    FIG. 10B

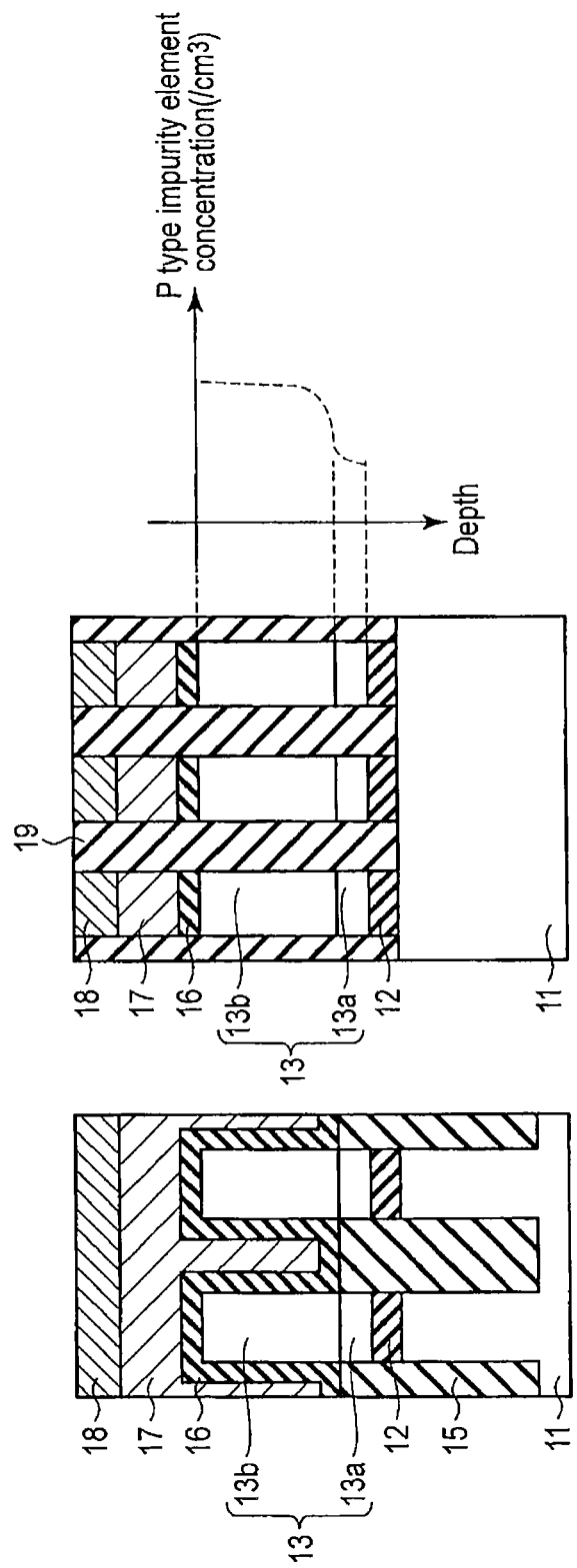

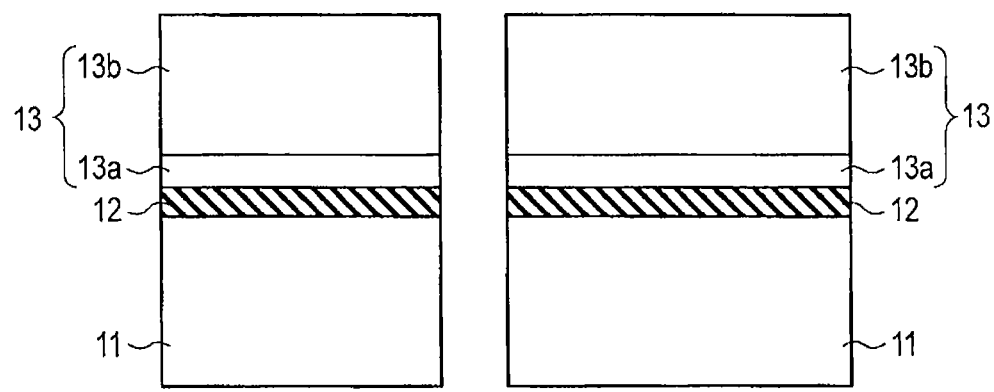
F I G. 12A   F I G. 12B

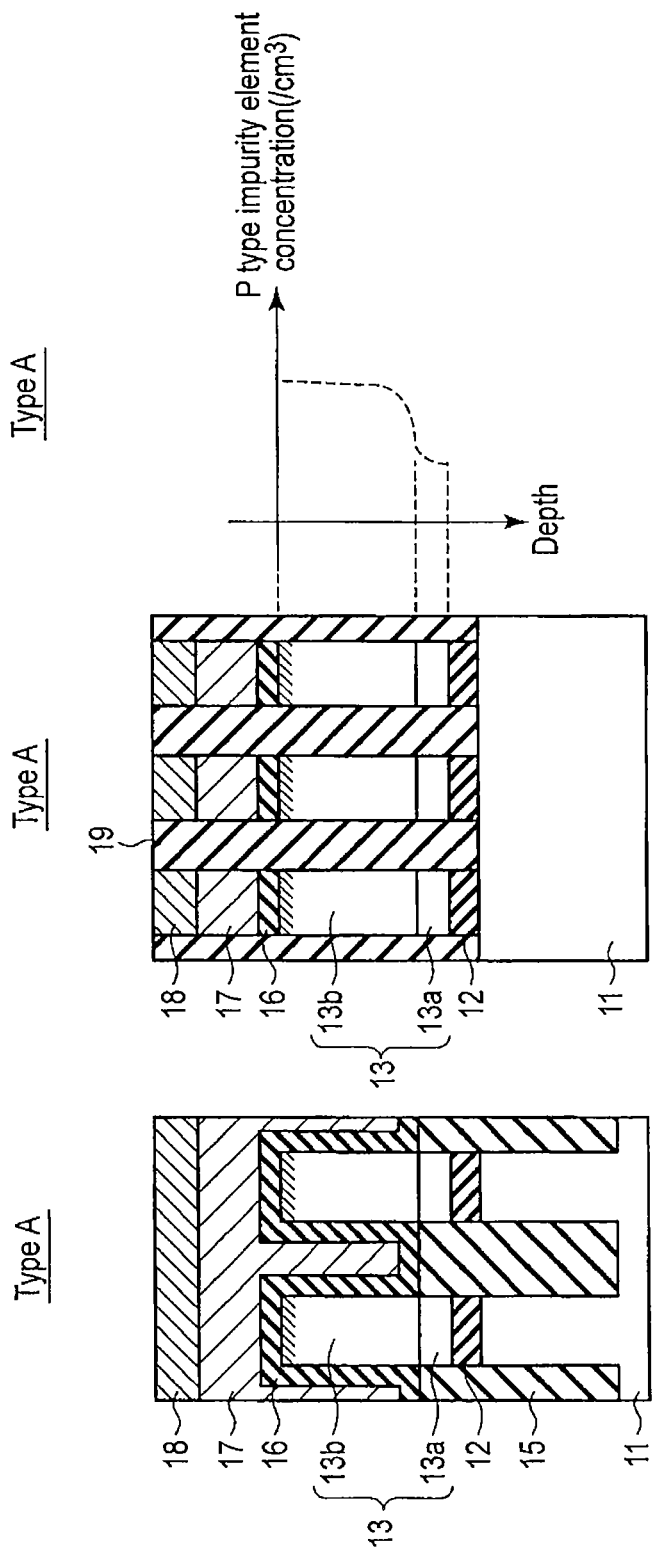

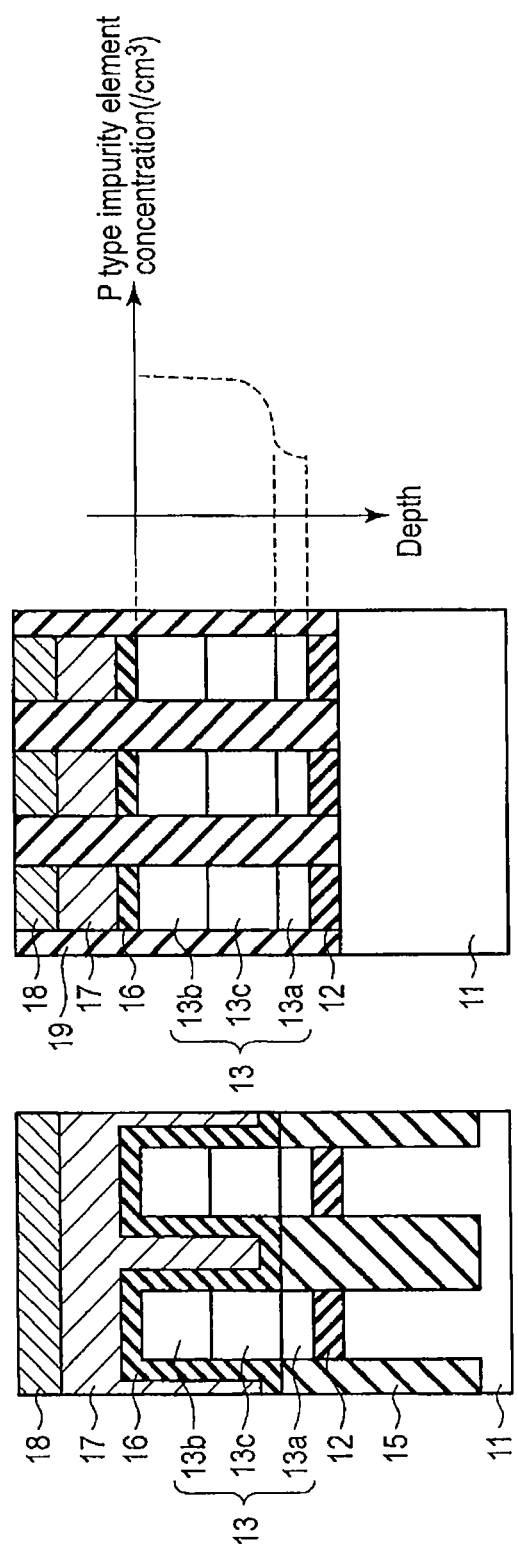

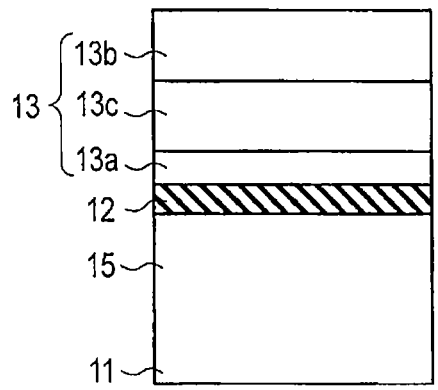 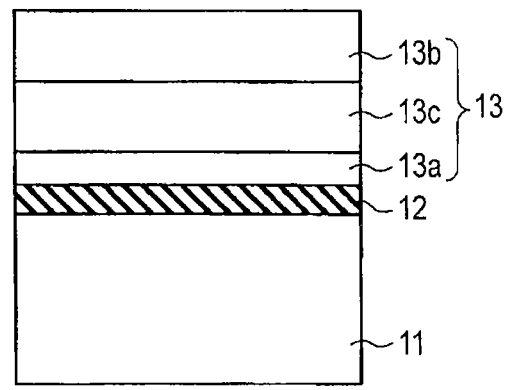
F I G. 16A  F I G. 16B
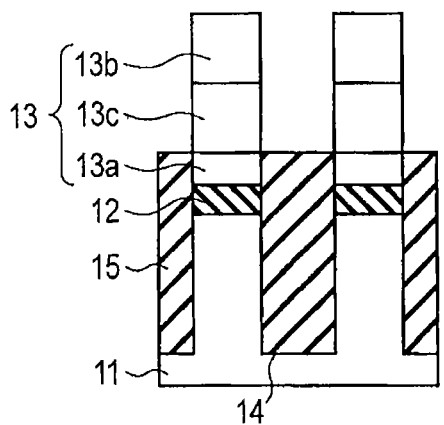 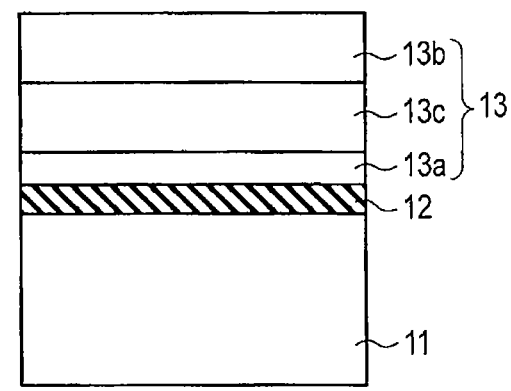
F I G. 17A  F I G. 17B

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2011-261995, filed Nov. 30, 2011, the entire contents of which are incorporated herein by reference.

FIELD

Embodiments described herein relate generally to a nonvolatile semiconductor memory device including a floating gate electrode made of p-type polysilicon, and a method of manufacturing the same.

BACKGROUND

Conventionally, when forming a floating gate (to be referred to as an FG hereinafter) electrode made of p-type polysilicon of a nonvolatile semiconductor memory device, a p-type impurity such as boron is doped by ion implantation or plasma doping. Even when the p-type impurity is doped in a shallow portion of the FG film, the p-type impurity diffuses through an annealing step to be performed later, so the p-type impurity concentration distribution in the FG film becomes uniform.

The operation of an FG cell formed as described above poses the following problem. If the concentration of the p-type impurity is relatively low, the FG upper portion may be depleted during a write operation, and this may worsen the write operation. On the other hand, if the concentration of the p-type impurity is relatively high, electrons necessary for erase may not be supplied to the FG lower portion during an erase operation, and this may make the erase operation impossible. As described above, the conventional method in which the p-type impurity such as boron uniformly distributes in the FG has the problem that it is difficult to reliably perform both a write operation and erase operation.

BRIEF DESCRIPTION OF THE DRAWINGS

FIG. 1 is a view for explaining the floating gate structure of a nonvolatile semiconductor memory device according to an embodiment;

FIG. 2A is a sectional view for explaining the memory structure of a nonvolatile semiconductor memory device according to the first embodiment, in which the bit line direction of a memory cell is shown;

FIG. 2B is a sectional view for explaining the memory structure of the nonvolatile semiconductor memory device according to the first embodiment, in which the word line direction of the memory cell is shown;

FIG. 2C is a view for explaining the memory structure of the nonvolatile semiconductor memory device according to the first embodiment, in which a p-type impurity concentration profile in the depth direction of an FG structure is shown;

FIG. 3A is a sectional view showing a memory cell manufacturing step in the bit line direction of the nonvolatile semiconductor memory device according to the first embodiment;

FIG. 3B is a sectional view showing a memory cell manufacturing step in the word line direction of the nonvolatile semiconductor memory device according to the first embodiment;

FIG. 4A is a sectional view, which follows FIG. 3A, showing a memory cell manufacturing step in the bit line direction of the nonvolatile semiconductor memory device according to the first embodiment;

FIG. 4B is a sectional view, which follows FIG. 3B, showing a memory cell manufacturing step in the word line direction of the nonvolatile semiconductor memory device according to the first embodiment;

FIG. 5A is a sectional view, which follows FIG. 4A, showing a memory cell manufacturing step in the bit line direction of the nonvolatile semiconductor memory device according to the first embodiment;

FIG. 5B is a sectional view, which follows FIG. 4B, showing a memory cell manufacturing step in the word line direction of the nonvolatile semiconductor memory device according to the first embodiment;

FIG. 6A is a sectional view, which follows FIG. 5A, showing a memory cell manufacturing step in the bit line direction of the nonvolatile semiconductor memory device according to the first embodiment;

FIG. 6B is a sectional view, which follows FIG. 5B, showing a memory cell manufacturing step in the word line direction of the nonvolatile semiconductor memory device according to the first embodiment;

FIG. 7A is a sectional view for explaining the memory cell structure (type A) of a nonvolatile semiconductor memory device according to the second embodiment, in which the bit line direction of a memory cell is shown;

FIG. 7B is a sectional view for explaining the memory cell structure (type A) of the nonvolatile semiconductor memory device according to the second embodiment, in which the word line direction of the memory cell is shown;

FIG. 7C is a view for explaining the memory cell structure (type A) of the nonvolatile semiconductor memory device according to the second embodiment, in which a p-type impurity concentration profile in the depth direction of an FG structure is shown;

FIG. 8A is a sectional view for explaining the memory cell structure (type B) of the nonvolatile semiconductor memory device according to the second embodiment, in which the bit line direction of a memory cell is shown;

FIG. 8B is a sectional view for explaining the memory cell structure (type B) of the nonvolatile semiconductor memory device according to the second embodiment, in which the word line direction of the memory cell is shown;

FIG. 8C is a view for explaining the memory cell structure (type B) of the nonvolatile semiconductor memory device according to the second embodiment, in which a p-type impurity concentration profile in the depth direction of an FG structure is shown;

FIG. 9A is a sectional view showing a memory cell (type A) manufacturing step in the bit line direction of the nonvolatile semiconductor memory device according to the second embodiment;

FIG. 9B is a sectional view showing a memory cell (type A) manufacturing step in the word line direction of the nonvolatile semiconductor memory device according to the second embodiment;

FIG. 10A is a sectional view showing a memory cell (type B) manufacturing step in the bit line direction of the nonvolatile semiconductor memory device according to the second embodiment;

FIG. 10B is a sectional view showing a memory cell (type B) manufacturing step in the word line direction of the nonvolatile semiconductor memory device according to the second embodiment;

FIG. 11A is a sectional view for explaining the memory structure of a nonvolatile semiconductor memory device according to the third embodiment, in which the bit line direction of a memory cell is shown;

FIG. 11B is a sectional view for explaining the memory structure of the nonvolatile semiconductor memory device according to the third embodiment, in which the word line direction of the memory cell is shown;

FIG. 11C is a view for explaining the memory structure of the nonvolatile semiconductor memory device according to the third embodiment, in which a p-type impurity concentration profile in the depth direction of an FG structure is shown;

FIG. 12A is a sectional view showing a memory cell manufacturing step in the bit line direction of the nonvolatile semiconductor memory device according to the third embodiment;

FIG. 12B is a sectional view showing a memory cell manufacturing step in the word line direction of the nonvolatile semiconductor memory device according to the third embodiment;

FIG. 13A is a sectional view for explaining the memory cell structure (type A) of a nonvolatile semiconductor memory device according to the fourth embodiment, in which the bit line direction of a memory cell is shown;

FIG. 13B is a sectional view for explaining the memory cell structure (type A) of the nonvolatile semiconductor memory device according to the fourth embodiment, in which the word line direction of the memory cell is shown;

FIG. 13C is a view for explaining the memory cell structure (type A) of the nonvolatile semiconductor memory device according to the fourth embodiment, in which a p-type impurity concentration profile in the depth direction of an FG structure is shown;

FIG. 15A is a sectional view for explaining the memory structure of a nonvolatile semiconductor memory device according to the fifth embodiment, in which the bit line direction of a memory cell is shown;

FIG. 15B is a sectional view for explaining the memory structure of the nonvolatile semiconductor memory device according to the fifth embodiment, in which the word line direction of the memory cell is shown;

FIG. 15C is a view for explaining the memory structure of the nonvolatile semiconductor memory device according to the fifth embodiment, in which a p-type impurity concentration profile in the depth direction of an FG structure is shown;

FIG. 16A is a sectional view showing a memory cell manufacturing step in the bit line direction of the nonvolatile semiconductor memory device according to the fifth embodiment;

FIG. 16B is a sectional view showing a memory cell manufacturing step in the word line direction of the nonvolatile semiconductor memory device according to the fifth embodiment;

FIG. 17A is a sectional view, which follows FIG. 16A, showing a memory cell manufacturing step in the bit line direction of the nonvolatile semiconductor memory device according to the fifth embodiment;

FIG. 17B is a sectional view, which follows FIG. 16B, showing a memory cell manufacturing step in the word line direction of the nonvolatile semiconductor memory device according to the fifth embodiment;

DETAILED DESCRIPTION

Figures 14A, 14B, 14C:
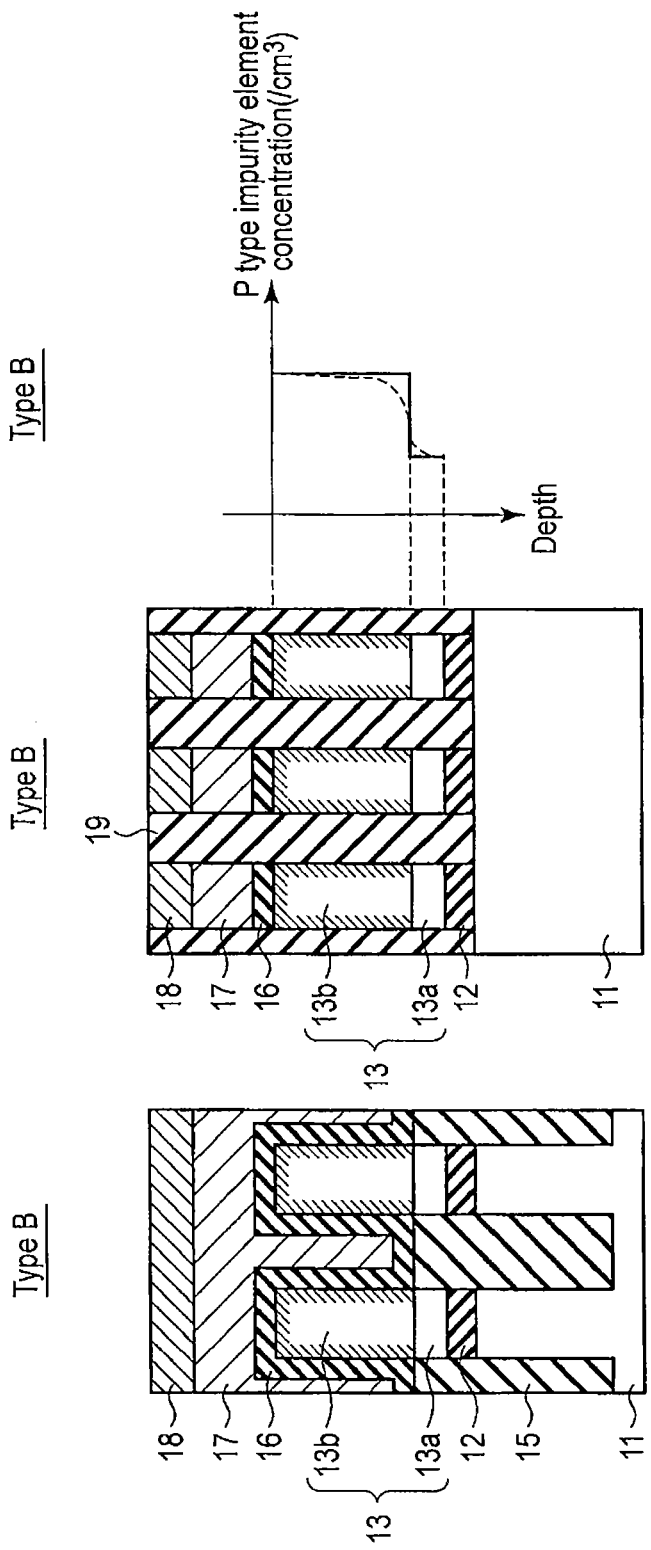
FIG. 14A is a sectional view for explaining the memory cell structure (type B) of the nonvolatile semiconductor memory device according to the fourth embodiment, in which the bit line direction of a memory cell is shown.
FIG. 14B is a sectional view for explaining the memory cell structure (type B) of the nonvolatile semiconductor memory device according to the fourth embodiment, in which the word line direction of the memory cell is shown.
FIG. 14C is a view for explaining the memory cell structure (type B) of the nonvolatile semiconductor memory device according to the fourth embodiment, in which a p-type impurity concentration profile in the depth direction of an FG structure is shown.

In general, according to one embodiment, a nonvolatile semiconductor memory device includes a semiconductor substrate, a gate insulating film formed on the semiconductor substrate, a floating gate electrode formed on the gate insulating film, made of polysilicon containing a p-type impurity as a group XIII element, and having a lower film and an upper film stacked on the lower film, an inter-electrode insulating film formed on the floating gate electrode, and a control gate electrode formed on the inter-electrode insulating film, wherein the concentration or activation concentration of the p-type impurity in the upper film is higher than one of a concentration and an activation concentration of the p-type impurity in the lower film.

[1] Outline

The floating gate (FG) electrode of the nonvolatile semiconductor memory device according to this embodiment will be explained below with reference to FIG. 1. Note that in this embodiment, a NAND flash memory that records data by storing electric charge in the floating gate electrode will be taken as an example of the nonvolatile semiconductor memory device.

In this embodiment, the floating gate electrode is made of polysilicon containing a p-type impurity as a group 13 element (e.g., boron (B), aluminum (Al), gallium (Ga), or indium (In)), and contains at least one of a diffusion inhibitor and activation promoter for the p-type impurity. The diffusion inhibitor contains at least one element selected from carbon (C), nitrogen (N), and fluorine (F), and the activation promoter contains germanium (Ge). This makes it possible to achieve a concentration distribution in which the p-type impurity in the upper portion of the floating gate electrode is higher than that in the lower portion of the floating gate electrode. Accordingly, it is possible to improve the characteristics of both a write operation and erase operation.

As shown in FIG. 1, practical examples are the FG structures of the first to fifth embodiments to be explained in detail later. In the first embodiment, an SiGe (silicon germanium) layer containing germanium as the activation promoter is used as an upper layer of the FG structure. In the second embodiment, a layer (to be referred to as a carbon-containing layer hereinafter) containing carbon as the diffusion inhibitor is used as an upper layer of the FG structure. In the third embodiment, the carbon-containing layer is used as a lower layer of the FG structure. In the fourth embodiment, the carbon-containing layer is used as both upper and lower layers of the FG structure. In the fifth embodiment, the carbon-containing layer is used as a middle layer of the FG structure.

In the second to fifth embodiments, each of the upper and middle layers of the FG structure can be either an SiGe layer or polysilicon layer. Also, when using the carbon-containing layer as the upper layer of the FG structure as in the second to fourth embodiments, the FG structure is classified into a structure (type A) in which the peak of the carbon concentration exists in the upper layer, and the carbon concentration has a one-dimensional concentration gradient in only the vertical direction (the carbon concentration is high on only the upper surface of the upper layer), and a structure (type B) in which the peak of the carbon concentration exists in the upper layer, and the carbon concentration has a two-dimensional concentration gradient in the vertical and horizontal directions (the carbon concentration is high not only on the upper surface but also on the side surfaces of the upper layer).

The first to fifth embodiments as described above will be described in detail below with reference to the accompanying drawings. In the following explanation, the same reference numerals denote the same parts throughout the drawings.

[2] First Embodiment

The first embodiment is a structure in which an SiGe film is used as an upper film of a floating gate electrode made of p-type polysilicon of a NAND flash memory, so a region of the floating gate electrode, which is surrounded in contact with a control gate electrode is made of the SiGe film.

[2-1] Structure

The memory cell structure of a nonvolatile semiconductor memory device according to the first embodiment will be explained below with reference to FIGS. 2A, 2B, and 2C. FIG. 2A shows an AA section in the bit line direction of a memory cell. FIG. 2B shows a GC section in the word line direction of the memory cell. FIG. 2C shows a p-type impurity (boron) concentration profile in the depth direction of the FG structure.

As shown in FIGS. 2A and 2B, a tunnel insulating film 12 is formed on a semiconductor substrate 11, a floating gate electrode 13 is formed on the tunnel insulating film 12, and a control gate electrode 17 is formed on an IPD film (interelectrode insulating film) 16 on the floating gate electrode 13.

A p-type impurity (e.g., boron) is doped in the floating gate electrode 13, and the floating gate electrode 13 has a two-layered structure in which an FG upper film 13b is stacked on an FG lower film 13a. The FG lower film 13a is made of a polysilicon film, and the FG upper film 13b is made of an SiGe film. Accordingly, a region of the floating gate electrode 13, which is surrounded in contact with the control gate electrode 17 is made of the SiGe film.

As shown in FIG. 2C, the boron concentration in the floating gate electrode 13 is higher in the FG upper film 13b than in the FG lower film 13a. More specifically, the boron concentration is highest near the uppermost surface of the FG upper film 13b (the surface of the FG upper film 13b, which is in contact with the IPD film 16), gradually decreases from the uppermost surface of the FG upper film 13b toward the lowermost surface (the surface of the FG upper film 13b, which is in contact with the FG lower film 13a), and largely decreases in the boundary between the FG upper film 13b and FG lower film 13a. The boron concentration in the FG lower film 13a gradually decreases from the uppermost surface of the FG lower film 13a (the surface of the FG lower film 13a, which is in contact with the FG upper film 13b) toward the lowermost surface (the surface of the FG lower film 13a, which is in contact with the tunnel insulating film 12). For example, the boron peak concentration in the FG upper film 13b is twice or more the boron concentration on the lowermost surface of the FG upper film 13b or in the FG lower film 13a.

This boron concentration distribution in the floating gate electrode 13 is implemented by forming the FG upper film 13b by the SiGe film. That is, germanium in the FG upper film 13b is a substance that promotes the activation of boron as a p-type impurity, and hence can raise the activation concentration of boron doped in the SiGe film. Therefore, the FG upper film 13b containing germanium can hold a high boron activation concentration when compared to the FG lower film 13a containing no germanium.

Note that in this embodiment as shown in FIGS. 2A and 2B, the film thickness of the FG upper film 13b is desirably larger than that of the FG lower film 13a in order to improve the controllability of the floating gate electrode 13. That is, as the generation advances, it becomes necessary to extend the control gate electrode 17 downward to the vicinity of the lower portion of the floating gate electrode 13.

Note also that in this embodiment as shown in FIGS. 2A and 2B, the upper surface of the FG lower film 13a is leveled with that of an element isolation insulating film 15. However, this embodiment is not limited to this. For example, the upper surface of the FG lower film 13a may also be higher or lower than that of the element isolation insulating film 15.

[2-2] Manufacturing Method

A method of manufacturing a memory cell of the nonvolatile semiconductor memory device according to the first embodiment will be explained below with reference to FIGS. 3A, 3B, 4A, 4B, 5A, 5B, 6A, and 6B. FIGS. 3A, 4A, 5A, and 6A each illustrate the AA section in the bit line direction of the memory cell. FIGS. 3B, 4B, 5B, and 6B each illustrate the GC section in the word line direction of the memory cell.

First, as shown in FIGS. 3A and 3B, a tunnel insulating film (e.g., a silicon oxide film) 12 is formed on a semiconductor substrate (e.g., a silicon substrate) 11, and an FG film (floating gate electrode) 13 is deposited on the tunnel insulating film 12. The FG film 13 has a two-layered structure in which an FG upper film 13b is stacked on an FG lower film 13a. The FG lower film 13a is made of a polysilicon film, and the FG upper film 13b is made of an SiGe film. The FG lower film 13a is deposited to have a film thickness matching a desired etch back height of an element isolation insulating film 15 to be explained later with reference to FIGS. 5A and 5B. After that, boron is doped as a p-type impurity in the FG upper film 13b.

Then, as shown in FIGS. 4A and 4B, the FG film 13, tunnel insulating film 12, and semiconductor substrate 11 are etched by RIE (Reactive Ion Etching) in the AA section, thereby forming an STI (Shallow Trench Isolation) trench 14 in the semiconductor substrate 11. After that, an element isolation insulating film 15 is buried in the STI trench 14.

Subsequently, as shown in FIGS. 5A and 5B, the element isolation insulating film 15 is etched back so that the upper surface of the element isolation insulating film 15 lowers to, e.g., the upper surface of the FG lower film 13a, thereby forming the element isolation insulating film 15 having the STI structure. Note that this etch back height is designed in advance by taking the breakdown voltage and electrical characteristics into consideration, but the etch back height is not limited to the height shown in FIGS. 5A and 5B and variously changeable.

As shown in FIGS. 6A and 6B, an IPD (Inter-Poly Dielectric) film 16 is deposited on the element isolation insulating film 15 and FG upper film 13b. Then, a CG film (control gate electrode) 17 made of, e.g., a polysilicon film is deposited on the IPD film 16, and an electrode material 18 is deposited on the CG film 17.

Subsequently, as shown in FIGS. 2A and 2B, the electrode material 18, CG film 17, IPD film 16, FG film 13, and tunnel insulating film 12 are etched by RIE in the CG section, thereby forming patterned FG electrodes and CG electrodes. After that, an oxide film 19 is buried between the FG electrodes and CG electrodes, and planarized until the electrode material 18 is exposed.

Note that in the manufacturing steps of this embodiment, an STI-air gap step or WL-air gap step may also be performed.

Note also that boron can be doped after the FG upper film 13b is stacked as shown FIGS. 3A and 3B, or in the state in which the upper surface and side surfaces of the FG upper film 13b are exposed as shown FIGS. 5A and 5B. The boron concentration rises on the upper surface of the FG upper film 13b in the former case, and rises on the upper surface and side surfaces of the FG upper film 13b in the latter case.

[2-3] Effects

In the above-mentioned first embodiment, a film (SiGe film) containing germanium as an activation promoter for a p-type impurity is used as the FG upper film 13b of the floating gate electrode 13. This makes it possible to raise the activation concentration of boron (a p-type impurity) in the FG upper film 13b made of the SiGe film.

Since the activation concentration of boron is high in the FG upper film 13b, therefore, it is possible, in a write operation, to suppress the depletion of a region of the floating gate electrode 13, which is in contact with the IPD film 16, thereby maintaining the write characteristic. On the other hand, the activation concentration of boron in the FG lower film 13a is lower than that in the FG upper film 13b. In an erase operation, therefore, it is possible to supply electrons (necessary for erase) sufficient to be drawn from the FG upper film 13b to the semiconductor substrate 11 through the FG lower film 13a, thereby implementing a good erase operation.

In this embodiment as described above, it is possible, by using the p-type floating gate electrode 13, to maximally utilize the effects of improving the retention characteristic and reducing the write voltage. In addition, the activation concentration of the p-type impurity in the floating gate electrode 13 is high in the FG upper film 13b and low in the FG lower film 13a, i.e., a concentration difference is produced. This makes it possible to improve both the write and erase characteristics.

[3] Second Embodiment

In the second embodiment, a carbon-containing layer is used as an upper layer of a floating gate electrode made of p-type polysilicon of a NAND flash memory cell. Note that in the second embodiment, an explanation of the same features as those of the above-mentioned first embodiment will be omitted, and differences will mainly be explained.

[3-1] Structure

The memory cell structure of a nonvolatile semiconductor memory device according to the second embodiment will be explained below with reference to FIGS. 7A, 7B, 7C, 8A, 8B, and 8C. FIGS. 7A and 8A each illustrate an AA section in the bit line direction of a memory cell. FIGS. 7B and 8B each illustrate a GC section in the word line direction of the memory cell. FIGS. 7C and 8C each illustrate a p-type impurity (boron) concentration profile in the depth direction of the FG structure.

As shown in FIGS. 7A, 7B, 8A, and 8B, the second embodiment differs from the above-mentioned first embodiment in that a carbon-containing layer containing carbon as a substance (diffusion inhibitor) that inhibits the diffusion of a p-type impurity is used as an FG upper film 13b. Note that as the diffusion inhibitor, it is also possible to use nitrogen or fluorine instead of carbon, or to use two or more elements selected from carbon, nitrogen, and fluorine.

In the structure of type A shown in FIGS. 7A and 7B, carbon uniformly exists in the horizontal direction near the interface between the upper surface of the FG upper film 13b and an IPD film 16, and the carbon concentration peak exists in the FG upper film 13b. In type A as shown in FIG. 7C, the boron concentration is highest on the uppermost surface of the FG upper film 13b, gradually decreases from the vicinity of the uppermost surface toward the lowermost surface of the FG upper film 13b, and largely decreases in the boundary between the FG upper film 13b and an FG lower film 13a. The boron concentration in the FG lower film 13a gradually decreases from the uppermost surface toward the lowermost surface of the FG lower film 13a.

On the other hand, in the structure of type B shown in FIGS. 8A and 8B, carbon two-dimensionally exists in the whole interface between the FG upper film 13b and IPD film 16, and the carbon concentration peak exists not only on the upper surface but also on the side surfaces of the FG upper film 13b. In type B as shown in FIG. 8C, the boron concentration in the middle portion of the floating gate electrode 13 is the same as that of type A. That is, the boron concentration is highest near the uppermost surface of the FG upper film 13b, gradually decreases from the uppermost surface toward the lowermost surface of the FG upper film 13b, and largely decreases in the boundary between the FG upper film 13b and FG lower film 13a. The boron concentration in the FG lower film 13a gradually decreases from the uppermost surface toward the lowermost surface of the FG lower film 13a (see the dotted lines in FIG. 8C). Also, in type B, the boron concentration on the side surfaces of a floating gate electrode 13 is almost constantly high from the uppermost surface to the lowermost surface of the FG upper film 13b, and almost constantly low from the uppermost surface to the lowermost surface of the FG lower film 13a (see the solid lines in FIG. 8C).

The boron concentration distributions in the floating gate electrodes 13 of type A and type B as described above are implemented because the FG upper film 13b contains carbon. That is, carbon in the FG upper film 13b can inhibit the diffusion of boron from the FG upper film 13b to the outside and to the FG lower film 13a in type A, and can inhibit the diffusion of boron from the FG upper film 13b to the outside in type B.

[3-2] Manufacturing Method of Type A

A method of manufacturing a memory cell of type A of the nonvolatile semiconductor memory device according to the second embodiment will be explained below with reference to FIGS. 9A and 9B. FIG. 9A shows the AA section in the bit line direction of the memory cell. FIG. 9B shows the GC section in the word line direction of the memory cell.

First, as shown in FIGS. 9A and 9B, a tunnel insulating film (e.g., a silicon oxide film) 12, an FG lower film (e.g., a polysilicon film) 13a, and an FG upper film 13b (e.g., an SiGe film or polysilicon film) are sequentially stacked on a semiconductor substrate (e.g., a silicon substrate) 11, in the same manner as in the first embodiment. Then, boron as a p-type impurity and carbon as a diffusion inhibitor for a p-type impurity are doped in the FG upper film 13b, thereby forming a carbon-containing layer. In this step, either boron or carbon can be doped first, and they can also be doped at the same time. After that, the structure shown in FIGS. 7A and 7B is formed through the steps shown in FIGS. 4A, 4B, 5A, 5B, 6A, 6B, 2A, and 2B, in the same manner as in the first embodiment.

Note that the method of forming the carbon-containing layer as the FG upper film 13b is not limited to the above-mentioned method of doping carbon in the FG upper film 13b by ion implantation. That is, it is also possible to stack a carbon-containing layer obtained by in-situ doping on the FG lower film 13a, or form a carbon-containing layer by epitaxially growing silicon containing carbon.

Also, boron doping need not be performed after the step of stacking the FG upper film 13b shown in FIGS. 9A and 9B, and may also be performed after the upper surface and side surfaces of the FG upper film 13b are exposed as in the step shown in FIGS. 5A and 5B explained in the first embodiment.

[3-3] Manufacturing Method of Type B

A method of manufacturing a memory cell of type B of the nonvolatile semiconductor memory device according to the second embodiment will be explained below with reference to FIGS. 10A and 10B. FIG. 10A shows the AA section in the bit line direction of the memory cell. FIG. 10B shows the GC section in the word line direction of the memory cell.

First, as shown in FIGS. 10A and 10B, a tunnel insulating film (e.g., a silicon oxide film) 12, an FG lower film (e.g., a polysilicon film) 13a, and an FG upper film 13b (e.g., an SiGe film or polysilicon film) are sequentially stacked on a semiconductor substrate (e.g., a silicon substrate) 11, in the same manner as in the first embodiment. Then, boron as a p-type impurity is doped in the FG upper film 13b. Subsequently, an STI trench 14 is formed in the semiconductor substrate 11, and an element isolation insulating film 15 is buried in the STI trench 14. The element isolation insulating film 15 is then etched back so that the upper surface of the element isolation insulating film 15 lowers to, e.g., the upper surface of the FG lower film 13a. Consequently, the upper surface and side surfaces of the FG upper film 13b are exposed. Subsequently, carbon as a diffusion inhibitor for a p-type impurity is doped in the exposed upper surface and side surfaces of the FG upper film 13b, thereby forming a carbon-containing layer. After that, the structure shown in FIGS. 8A and 8B is formed through the steps shown in FIGS. 6A, 6B, 2A, and 2B, in the same manner as in the first embodiment.

Boron doping need not be performed after the step of stacking the FG upper film 13b, and may also be performed after the upper surface and side surfaces of the FG upper film 13b are exposed as shown in FIGS. 10A and 10B.

[3-4] Effects

In the above-mentioned second embodiment, the carbon-containing layer containing carbon as a diffusion inhibitor for a p-type impurity is used as the FG upper film 13b of the floating gate electrode 13, thereby raising the carbon concentration in that portion of the FG upper film 13b, which is close to the interface with the IPD film 16 and strongly affected by the electric field of a control gate electrode 17. Even when applying an ion implantation step and annealing step in the same way as in the conventional method, therefore, carbon in the FG upper film 13b can inhibit the diffusion of boron from the FG upper film 13b to the outside and to the FG lower film 13a in type A, and can inhibit the diffusion of boron from the FG upper film 13b to the outside in type B. That is, boron doped in the FG upper film 13b can be kept in that portion of the FG upper film 13b, which is surrounded by the portion in contact with the IPD film 16 and directly affected by the electric field of the control gate electrode 17. This makes it possible to implement a p-type floating gate electrode 13 including the high-concentration FG upper film 13b and low-concentration FG lower film 13a, thereby improving both the write and erase characteristics, as in the first embodiment.

Also, when using an SiGe film as the FG upper film 13b in the second embodiment, it is possible to obtain the same effects as those of the first embodiment, and further improve the write and erase characteristics.

[4] Third Embodiment

In the third embodiment, a carbon-containing layer is used as a lower layer of a floating gate electrode made of p-type polysilicon of a NAND flash memory cell. Note that in the third embodiment, an explanation of the same features as those of the above-mentioned first embodiment will be omitted, and differences will mainly be explained.

[4-1] Structure

The memory cell structure of a nonvolatile semiconductor memory device according to the third embodiment will be explained below with reference to FIGS. 11A, 11B, and 11C. FIG. 11A shows an AA section in the bit line direction of a memory cell. FIG. 11B shows a GC section in the word line direction of the memory cell. FIG. 11C shows a p-type impurity (boron) concentration profile in the depth direction of the FG structure.

As shown in FIGS. 11A and 11B, the third embodiment differs from the above-mentioned first embodiment in that a carbon-containing layer containing carbon as a diffusion inhibitor for a p-type impurity is used as an FG lower film 13a. Note that as the diffusion inhibitor, it is also possible to use nitrogen or fluorine instead of carbon, or to use two or more elements selected from carbon, nitrogen, and fluorine.

As shown in FIG. 11C, the boron concentration in a floating gate electrode 13 of the third embodiment is higher in an FG upper film 13b than in the FG lower film 13a, as in the first embodiment. More specifically, the boron concentration is highest near the uppermost surface of the FG upper film 13b, gradually decreases from the uppermost surface toward the lowermost surface of the FG upper film 13b, and largely decreases in the boundary between the FG upper film 13b and FG lower film 13a. The boron concentration in the FG lower film 13a gradually decreases from the uppermost surface toward the lowermost surface of the FG lower film 13a.

The boron concentration distribution in the floating gate electrode 13 as described above is implemented because the FG lower film 13a contains carbon. That is, carbon in the FG lower film 13a can inhibit the diffusion of boron from the FG upper film 13b to the FG lower film 13a.

[4-2] Manufacturing Method

A method of manufacturing a memory cell of the nonvolatile semiconductor memory device according to the third embodiment will be explained below with reference to FIGS. 12A and 12B. FIG. 12A shows the AA section in the bit line direction of the memory cell. FIG. 12B shows the GC section in the word line direction of the memory cell.

First, as shown in FIGS. 12A and 12B, a tunnel insulating film (e.g., a silicon oxide film) 12 and an FG lower film (e.g., a polysilicon film) 13a are sequentially stacked on a semiconductor substrate (e.g., a silicon substrate) 11, in the same manner as in the first embodiment. Then, carbon as a diffusion inhibitor for a p-type impurity is doped in the FG lower film 13a, thereby forming a carbon-containing layer. Subsequently, an FG upper film 13b (e.g., an SiGe film or polysilicon film) is deposited on the FG lower film 13a. Boron as a p-type impurity is doped in the FG upper film 13b. After that, the structure shown in FIGS. 12A and 12B is formed through the steps shown in FIGS. 4A, 4B, 5A, 5B, 6A, 6B, 2A, and 2B, in the same manner as in the first embodiment.

Note that the method of forming the carbon-containing layer as the FG lower film 13a is not limited to the above-mentioned method of doping carbon in the FG lower film 13a by ion implantation. That is, it is also possible to stack a carbon-containing layer obtained by in-situ doping on the tunnel insulating film 12, or form a carbon-containing layer by epitaxially growing silicon containing carbon.

Also, boron doping need not be performed after the step of stacking the FG upper film 13b shown in FIGS. 12A and 12B, and may also be performed after the upper surface and side surfaces of the FG upper film 13b are exposed as in the step shown in FIGS. 5A and 5B explained in the first embodiment.

[4-3] Effects

In the above-mentioned third embodiment, the carbon-containing layer containing carbon as a diffusion inhibitor for a p-type impurity is used as the FG lower film 13a of the floating gate electrode 13. Even when applying an ion implantation step and annealing step in the same way as in the conventional method, therefore, carbon in the FG lower film 13a can inhibit the diffusion of boron from the FG upper film 13b to the FG lower film 13a. That is, boron doped in the FG upper film 13b can be kept in that portion of the FG upper film 13b, which is surrounded by the portion in contact with the IPD film 16 and directly affected by the electric field of a control gate electrode 17. This makes it possible to implement a p-type floating gate electrode 13 including the high-concentration FG upper film 13b and low-concentration FG lower film 13a, thereby improving both the write and erase characteristics, as in the first embodiment.

Also, when using an SiGe film as the FG upper film 13b in the third embodiment, it is possible to obtain the same effects as those of the first embodiment, and further improve the write and erase characteristics.

[5] Fourth Embodiment

The fourth embodiment is a structure obtained by combining the second and third embodiments, i.e., a carbon-containing layer is used as both an upper layer and lower layer of a floating gate electrode made of p-type polysilicon of a NAND flash memory cell. Note that in the fourth embodiment, an explanation of the same features as those of the above-mentioned first to third embodiments will be omitted, and differences will mainly be explained.

[5-1] Structure

The memory cell structure of a nonvolatile semiconductor memory device according to the fourth embodiment will be explained below with reference to FIGS. 13A, 13B, 13C, 14A, 14B, and 14C. FIGS. 13A and 14A each illustrate an AA section in the bit line direction of a memory cell. FIGS. 13B and 14B each illustrate a GC section in the word line direction of the memory cell. FIGS. 13C and 14C each illustrate a p-type impurity (boron) concentration profile in the depth direction of the FG structure.

As shown in FIGS. 13A, 13B, 14A, and 14B, the fourth embodiment is the structure obtained by combining the above-mentioned second and third embodiments, i.e., a carbon-containing layer is used as both an FG lower film 13a and FG upper film 13b. Note that as a diffusion inhibitor, it is also possible to use nitrogen or fluorine instead of carbon, or to use two or more elements selected from carbon, nitrogen, and fluorine. Note also that diffusion inhibitors in the FG lower film 13a and FG upper film 13b may be made of the same element or different elements.

In the structure of type A shown in FIGS. 13A and 13B, carbon uniformly exists in the horizontal direction near the interface between the upper surface of the FG upper film 13b and an IPD film 16, and the carbon concentration peak exists in the FG upper film 13b. In type A as shown in FIG. 13C, the boron concentration is highest near the uppermost surface of the FG upper film 13b, gradually decreases from the uppermost surface toward the lowermost surface of the FG upper film 13b, and largely decreases in the boundary between the FG upper film 13b and FG lower film 13a. The boron concentration in the FG lower film 13a gradually decreases from the uppermost surface toward the lowermost surface of the FG lower film 13a.

On the other hand, in the structure of type B shown in FIGS. 14A and 14B, carbon two-dimensionally exists in the whole interface between the FG upper film 13b and IPD film 16, and the carbon concentration peak exists not only on the upper surface but also on the side surfaces of the FG upper film 13b. In type B as shown in FIG. 14C, the boron concentration in the middle portion of the floating gate electrode 13 is the same as that of type A. That is, the boron concentration is highest near the uppermost surface of the FG upper film 13b, gradually decreases from the uppermost surface toward the lowermost surface of the FG upper film 13b, and largely decreases in the boundary between the FG upper film 13b and FG lower film 13a. The boron concentration in the FG lower film 13a gradually decreases from the uppermost surface toward the lowermost surface of the FG lower film 13a (see the dotted lines in FIG. 14C). Also, in type B, the boron concentration on the side surfaces of a floating gate electrode 13 is almost constantly high from the uppermost surface to the lowermost surface of the FG upper film 13b, and almost constantly low from the uppermost surface to the lowermost surface of the FG lower film 13a (see the solid lines in FIG. 14C).

The boron concentration distributions in the floating gate electrodes 13 of type A and type B as described above are implemented because the FG lower film 13a and FG upper film 13b contain carbon. That is, carbon in the FG lower film 13a can inhibit the diffusion of boron from the FG upper film 13b to the FG lower film 13a. Also, carbon in the FG upper film 13b can inhibit the diffusion of boron from the FG upper film 13b to the outside and to the FG lower film 13a in type A, and can inhibit the diffusion of boron from the FG upper film 13b to the outside in type B.

[5-2] Effects

In the above-mentioned fourth embodiment, the carbon-containing layer containing carbon as a diffusion inhibitor for a p-type impurity is used as the FG lower film 13a and FG upper film 13b of the floating gate electrode 13, thereby raising the carbon concentration in that portion of the FG upper film 13b, which is close to the interface with the IPD film 16 and strongly affected by the electric field of a control gate electrode 17. Even when applying an ion implantation step and annealing step in the same way as in the conventional method, therefore, carbon in the FG lower film 13a can inhibit the diffusion of boron from the FG upper film 13b to the FG lower film 13a. In addition, carbon in the FG upper film 13b can inhibit the diffusion of boron from the FG upper film 13b to the outside and to the FG lower film 13a in type A, and can inhibit the diffusion of boron from the FG upper film 13b to the outside in type B. That is, boron doped in the FG upper film 13b can be kept in that portion in the FG upper film 13b, which is surrounded by the portion in contact with the IPD film 16 and directly affected by the electric field of the control gate electrode 17. This makes it possible to implement a p-type floating gate electrode 13 including the high-concentration FG upper film 13b and low-concentration FG lower film 13a, thereby improving both the write and erase characteristics, as in the first to third embodiments.

Also, when using an SiGe film as the FG upper film 13b in the fourth embodiment, it is possible to obtain the same effects as those of the first embodiment, and further improve the write and erase characteristics.

[6] Fifth Embodiment

In the fifth embodiment, a carbon-containing layer is used as a middle layer of a floating gate electrode made of p-type polysilicon of a NAND flash memory cell. Note that in the fifth embodiment, an explanation of the same features as those of the above-mentioned first to fourth embodiments will be omitted, and differences will mainly be explained.

[6-1] Structure

The memory cell structure of a nonvolatile semiconductor memory device according to the fifth embodiment will be explained below with reference to FIGS. 15A, 15B, and 15C. FIG. 15A shows an AA section in the bit line direction of a memory cell. FIG. 15B shows a GC section in the word line direction of the memory cell. FIG. 15C shows a p-type impurity (boron) concentration profile in the depth direction of the FG structure.

As shown in FIGS. 15A and 15B, the fifth embodiment differs from the above-mentioned first to fourth embodiments in that a floating gate electrode 13 has a three-layered structure including an FG lower film 13a, FG middle film 13c, and FG upper film 13b, and a carbon-containing layer is used as the FG middle film 13c. Note that as a diffusion inhibitor, it is also possible to use nitrogen or fluorine instead of carbon, or to use two or more elements selected from carbon, nitrogen, and fluorine.

As shown in FIG. 15C, the boron concentration in the floating gate electrode 13 of the fifth embodiment is the same as that of the first embodiment. That is, the boron concentration is highest near the uppermost surface of the FG upper film 13b, gradually decreases from the uppermost surface toward the lowermost surface of the FG upper film 13b, and largely decreases in the boundary between the FG upper film 13b and FG lower film 13a. The boron concentration in the FG lower film 13a gradually decreases from the uppermost surface toward the lowermost surface of the FG lower film 13a.

The boron concentration distribution in the floating gate electrode 13 as described above is implemented because the FG middle film 13c contains carbon. That is, carbon in the FG middle film 13c can inhibit the diffusion of boron from the FG upper film 13b to the FG lower film 13a, and can inhibit the diffusion of boron from the FG middle film 13c to the outside.

Note that in the floating gate electrode 13 having the three-layered structure as in the fifth embodiment, the carbon-containing layer need not be used as the FG middle film 13c alone, and may also be used as at least one of the FG lower film 13a, FG middle film 13c, and FG upper film 13b. That is, in the floating gate electrode 13 having the three-layered structure, the carbon-containing layer can be used as one of the FG lower film 13a and FG upper film 13b, both of the FG lower film 13a and FG upper film 13b, both of the FG middle film 13c and FG upper film 13b, both of the FG lower film 13a and FG middle film 13c, and all of the FG lower film 13a, FG middle film 13c, and FG upper film 13b. Furthermore, even when the floating gate electrode 13 has a multilayered structure including four or more layers, at least one layer can be the carbon-containing layer.

The film thickness of the FG middle film 13c is desirably larger than that of the FG lower film 13a, in order to increase the p-type impurity diffusion inhibiting effect. The film thickness of the FG middle film 13c may be the same as or different from that of the FG upper film 13b.

[6-2] Manufacturing Method

A method of manufacturing a memory cell of the nonvolatile semiconductor memory device according to the fifth embodiment will be explained below with reference to FIGS. 16A, 16B, 17A, and 17B. FIGS. 16A and 17A each illustrate the AA section in the bit line direction of the memory cell. FIGS. 16B and 17B each illustrate the GC section in the word line direction of the memory cell.

First, as shown in FIGS. 16A and 16B, a tunnel insulating film (e.g., a silicon oxide film) 12, an FG lower film (e.g., a polysilicon film) 13a, and an FG middle film (e.g., an SiGe film or polysilicon film) 13c are sequentially stacked on a semiconductor substrate (e.g., a silicon substrate) 11. Then, carbon as a diffusion inhibitor for a p-type impurity is doped in the FG middle film 13c, thereby forming a carbon-containing layer. Subsequently, an FG upper film 13b (e.g., an SiGe film or polysilicon film) is deposited on the FG middle film 13c. After that, boron as a p-type impurity is doped in the FG upper film 13b.

Then, as shown in FIGS. 17A and 17B, an STI trench 14 is formed in the semiconductor substrate 11, and an element isolation insulating film 15 is buried in the STI trench 14. The element isolation insulating film 15 is then etched back so that the upper surface of the element isolation insulating film 15 lowers to, e.g., the upper surface of the FG lower film 13a. Consequently, the upper surface and side surfaces of the FG upper film 13b and the side surfaces of the FG middle film 13c are exposed. After that, the structure shown in FIGS. 15A and 15B is formed through the steps shown in FIGS. 6A, 6B, 2A, and 2B, in the same manner as in the first embodiment.

Note that the method of forming the carbon-containing layer as the FG middle film 13c is not limited to the above-mentioned method of doping carbon in the FG middle film 13c (e.g., an SiGe film or polysilicon film) by ion implantation. That is, it is also possible to stack a carbon-containing layer obtained by in-situ doping on the FG lower film 13a, or form a carbon-containing layer by epitaxially growing silicon containing carbon.

Also, boron doping need not be performed after the step of stacking the FG upper film 13b, and may also be performed after the upper surface and side surfaces of the FG upper film 13b and the side surfaces of the FG middle film 13c are exposed as shown in FIGS. 17A and 17B.

[6-3] Effects

In the above-mentioned fifth embodiment, the carbon-containing layer containing carbon as a diffusion inhibitor for a p-type impurity is used as the FG middle film 13c of the floating gate electrode 13. Even when applying an ion implantation step and annealing step in the same way as in the conventional method, therefore, carbon in the FG middle film 13c can inhibit the diffusion of boron from the FG upper film 13b to the FG lower film 13a, and can also inhibit the diffusion of boron from the FG middle film 13c to the outside. That is, boron doped in the FG upper film 13b and FG middle film 13c can be kept in those portions of the FG upper film 13b and FG middle film 13c, which are surrounded by the portion in contact with the IPD film 16 and directly affected by the electric field of a control gate electrode 17. This makes it possible to implement a p-type floating gate electrode 13 including the high-concentration FG upper film 13b, high-concentration FG middle film 13c, and low-concentration FG lower film 13a, thereby improving both the write and erase characteristics, as in the first to fourth embodiments.

Also, when using an SiGe film as the FG upper film 13b and FG middle film 13c in the fifth embodiment, it is possible to obtain the same effects as those of the first embodiment, and further improve the write and erase characteristics.

[7] Others

[7-1] P-Type Impurity Concentration and Activation Concentration

Figures 18A, 18B:
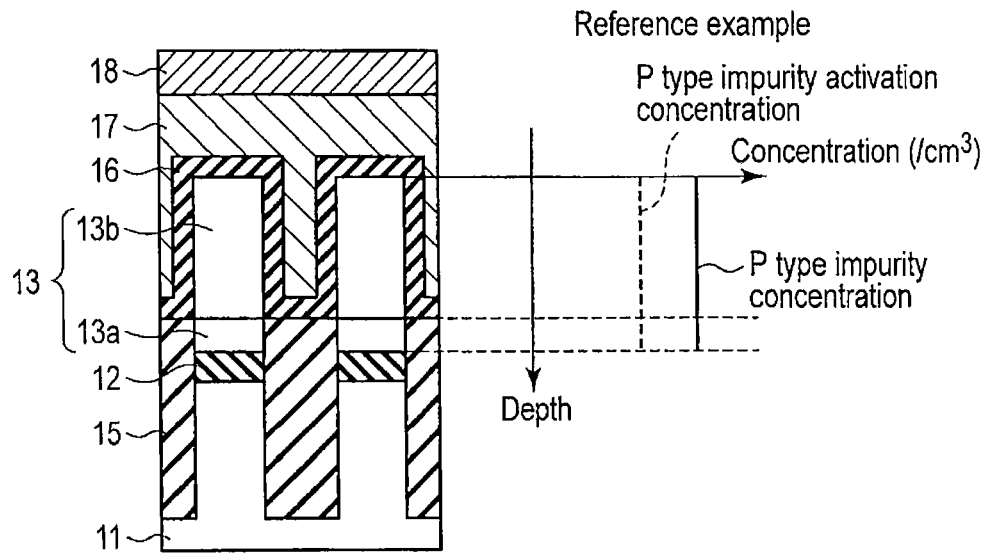
FIG. 18A is a sectional view for explaining the activation concentration of a p-type impurity in a floating gate electrode according to a reference example, in which the bit line direction of a memory cell is shown.
FIG. 18B is a view for explaining the activation concentration of the p-type impurity in the floating gate electrode according to the reference example, in which p-type impurity concentration and activation concentration profiles in the depth direction of an FG structure are shown.
Figures 19A, 19B:
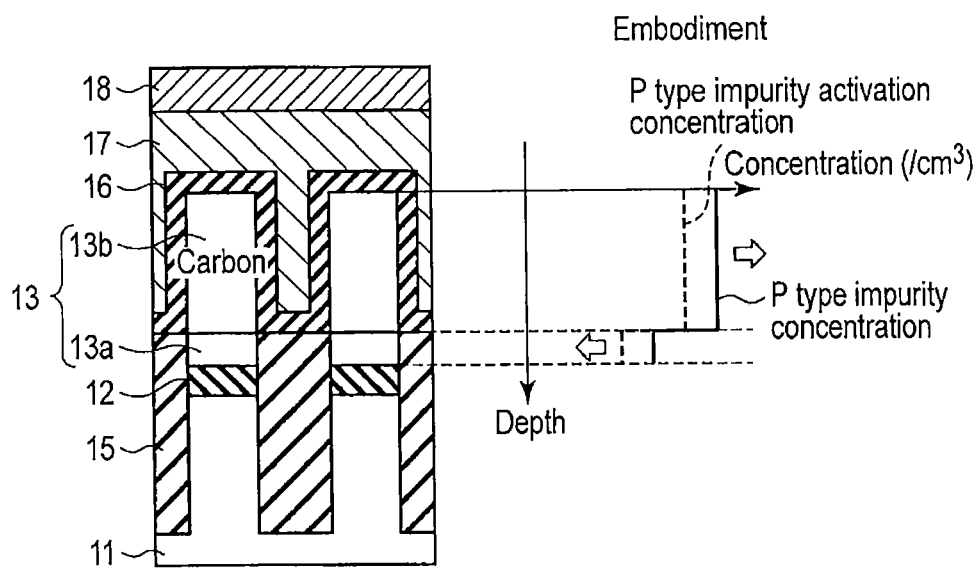
FIG. 19A is a sectional view for explaining the activation concentration of a p-type impurity in a floating gate electrode according to each embodiment, in which the bit line direction of a memory cell is shown.
FIG. 19B is a view for explaining the activation concentration of the p-type impurity in the floating gate electrode according to each embodiment, in which p-type impurity concentration and activation concentration profiles in the depth direction of an FG structure are shown.

The p-type impurity concentrations and activation concentrations of floating gate electrodes according to a reference example and each of the above-mentioned embodiments will be explained below with reference to FIGS. 18A, 18B, 19A, and 19B. FIGS. 18A and 18B show the reference example in which the floating gate electrode contains neither the diffusion inhibitor nor the activation promoter for a p-type impurity. FIGS. 19A and 19B show each of the aforementioned embodiments in which the floating gate electrode contains at least one of the diffusion inhibitor and activation promoter for a p-type impurity.

In the reference example as shown in FIGS. 18A and 18B, the p-type impurity concentration (solid line) and the activation concentration (dotted line) of the floating gate electrode 13 are constant in the FG upper film 13b and FG lower film 13a. The impurity concentration (solid line) is generally lower than the activation concentration (dotted line).

On the other hand, in each of the above-described embodiments as shown in FIGS. 19A and 19B, the p-type impurity concentration (solid line) and the activation concentration (dotted line) of the floating gate electrode 13 are higher in the FG upper film 13b than in the FG lower film 13a. Also, in each of the FG lower film 13a and FG upper film 13b, the impurity concentration (solid line) is lower than the activation concentration (dotted line). To improve both the write and erase characteristics, as indicated by arrows in FIG. 19B, the p-type impurity concentration and activation concentration in the FG upper film 13b are desirably high, and those in the FG lower film 13a are desirably low. That is, the FG upper film 13b and FG lower film 13a desirably increase the difference between the p-type impurity concentrations and that between the activation concentrations.

The impurity concentration means the total concentration of impurity elements contained in a target region. The impurity activation concentration means an element concentration within an Si crystal lattice among other impurity concentrations, and the higher the impurity activation concentration, the higher the electrical activity. Accordingly, these two concentrations are different concepts. As shown in FIGS. 18B and 19B, however, the impurity concentration and impurity activation concentration indicate identical distributions although numerical values are different. That is, the impurity concentration and impurity activation concentration have the relationship that when the impurity concentration is raised, the impurity activation concentration also rises. Therefore, it is possible to regard "the impurity concentration" and "the activation concentration" as having the same meaning. Accordingly, the p-type impurity concentration distribution in the floating gate electrode 13 explained in each of the above embodiments can be replaced with the activation concentration distribution of the p-type impurity.

That is, in each embodiment, to improve both the write and erase characteristics, the p-type impurity concentration in the FG upper film 13b (and the FG middle film 13c) is increased and that in the FG lower film 13a is decreased in the p-type floating gate electrode 13, and attention is particularly focused on "the p-type impurity concentration". However, "the p-type impurity concentration" can also be regarded as "the activation concentration of the p-type impurity concentration". In each of the above-mentioned embodiments, therefore, the p-type impurity activation concentration in the FG upper film 13b (and the FG middle film 13c) is increased, and the p-type impurity activation concentration in the FG lower film 13a is decreased. On the contrary, it is also possible to replace the p-type impurity activation concentration with the p-type impurity concentration.

Note that in this embodiment, it is finally desirable to produce a difference between the p-type impurity activation concentrations in the FG upper film 13b and FG lower film 13a, in order to obtain the above-described effects. Increasing the activation concentration is to increase the ratio of activated elements with respect to the total concentration of impurities, and make the dotted line (activation concentration) approach the solid line (impurity concentration).

[7-2] MONOS Type

In each of the aforementioned embodiments, the p-type impurity concentration distribution in the FG type floating gate electrode of a NAND flash memory has been described. However, the p-type impurity concentration distribution in each embodiment is also applicable to a MONOS type charge storage layer. This makes it possible to improve the write and erase characteristics even in a MONOS type nonvolatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   a gate insulating film formed on the semiconductor substrate;
   a floating gate electrode formed on the gate insulating film, made of polysilicon containing a p-type impurity as a group 13 element, and having a lower film and an upper film stacked on the lower film;
   an inter electrode insulating film formed on the floating gate electrode; and
   a control gate electrode formed on the inter electrode insulating film,
   wherein one of a concentration and an activation concentration of the p-type impurity in the upper film is higher than one of a concentration and an activation concentration of the p-type impurity in the lower film,
   the floating gate electrode has a peak of the one of the concentration and the activation concentration of the p-type impurity in an upper surface and a side surface of the upper film, and
   the one of the concentration and the activation concentration of the p-type impurity in the upper film is substantially constant in the upper surface and the side surface of the upper film.

2. The nonvolatile semiconductor memory device according to claim 1, wherein one of the concentration and the activation concentration of the p-type impurity in the upper film is not less than twice one of the concentration and the activation concentration of the p-type impurity in the lower film.

3. The nonvolatile semiconductor memory device according to claim 1, wherein the upper film contains a diffusion inhibitor for the p-type impurity, and concentration of the diffusion inhibitor in the upper surface and the side surface of the upper film is not less than a concentration of the diffusion inhibitor in a middle portion of the upper film.

4. The nonvolatile semiconductor memory device according to claim 1, wherein the upper film contains a diffusion inhibitor for the p-type impurity, and the diffusion inhibitor exists in an interface between the upper film and the inter electrode insulating film.

5. The nonvolatile semiconductor memory device according to claim 1, wherein the one of the concentration and the activation concentration of the p-type impurity in the upper surface and the side surface of the upper film is not less than the one of the concentration and the activation concentration of the p-type impurity in a middle portion of the upper film.

6. The nonvolatile semiconductor memory device according to claim 1, wherein
the floating gate electrode contains at least one of a diffusion inhibitor and an activation promoter for the p-type impurity,
the diffusion inhibitor contains at least one element selected from the group consisting of carbon, nitrogen, and fluorine, and
the activation promoter contains germanium.

7. The nonvolatile semiconductor memory device according to claim 6, wherein the diffusion inhibitor is distributed in at least one of the upper film and the lower film.

8. The nonvolatile semiconductor memory device according to claim 7, wherein the activation promoter is distributed in a region of the upper film, the region is surrounded by an interface between the floating gate electrode and the control gate electrode.

9. A nonvolatile semiconductor memory device manufacturing method comprising:
forming a gate insulating film on the semiconductor substrate;
forming, on the gate insulating film, a floating gate electrode made of polysilicon containing a p-type impurity as a group 13 element, and having a lower film and an upper film stacked on the lower film;
forming an inter electrode insulating film on the floating gate electrode; and
forming a control gate electrode on the inter electrode insulating film,
wherein one of a concentration and an activation concentration of the p-type impurity in the upper film is higher than one of a concentration and an activation concentration of the p-type impurity in the lower film,
the floating gate electrode has a peak of the one of the concentration and the activation concentration of the p-type impurity in an upper surface and a side surface of the upper film, and
the one of the concentration and the activation concentration of the p-type impurity in the upper film is substantially constant in the upper surface and the side surface of the upper film.

10. The nonvolatile semiconductor memory device manufacturing method according to claim 9, wherein one of the concentration and the activation concentration of the p-type impurity in the upper film is not less than twice one of the concentration and the activation concentration of the p-type impurity in the lower film.

11. The nonvolatile semiconductor memory device manufacturing method according to claim 9, wherein the upper film containing a diffusion inhibitor for the p-type impurity is formed, and concentration of the diffusion inhibitor in the upper surface and the side surface of the upper film is not less than a concentration of the diffusion inhibitor in a middle portion of the upper film.

12. The nonvolatile semiconductor memory device manufacturing method according to claim 9, wherein the upper film containing a diffusion inhibitor for the p-type impurity is formed, and the diffusion inhibitor exists in an interface between the upper film and the inter electrode insulating film.

13. The nonvolatile semiconductor memory device manufacturing method according to claim 9, wherein the one of the concentration and the activation concentration of the p-type impurity in the upper surface and the side surface of the upper film is not less than the one of the concentration and the activation concentration of the p-type impurity in a middle portion of the upper film.

14. The nonvolatile semiconductor memory device manufacturing method according to claim 9, wherein
the floating gate electrode contains at least one of a diffusion inhibitor and an activation promoter for the p-type impurity,
the diffusion inhibitor contains at least one element selected from the group consisting of carbon, nitrogen, and fluorine, and
the activation promoter contains germanium.

15. The nonvolatile semiconductor memory device manufacturing method according to claim 14, wherein the diffusion inhibitor is distributed in at least one of the upper film and the lower film.

16. The nonvolatile semiconductor memory device manufacturing method according to claim 15, wherein the activation promoter is distributed in a region of the upper film, the region is surrounded by an interface between the floating gate electrode and the control gate electrode.

* * * * *